US012706287B2

(12) United States Patent
Park et al.

(10) Patent No.: US 12,706,287 B2
(45) Date of Patent: Aug. 11, 2026

(54) PLASMA ETCHING WITH METAL SPUTTERING

(71) Applicant: Tokyo Electron Limited, Tokyo (JP)

(72) Inventors: Minjoon Park, Albany, NY (US); Andrew Metz, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 575 days.

(21) Appl. No.: 18/156,900

(22) Filed: Jan. 19, 2023

(65) Prior Publication Data

US 2024/0249927 A1 Jul. 25, 2024

(51) Int. Cl.

*H01J 37/34* (2006.01)
*H01J 37/32* (2006.01)
*H10P 50/00* (2026.01)
*H10P 50/28* (2026.01)

(52) U.S. Cl.

CPC .... *H01J 37/3473* (2013.01); *H01J 37/32642* (2013.01); *H01J 37/32743* (2013.01); *H10P 50/283* (2026.01); *H10P 50/73* (2026.01); *H01J 37/32091* (2013.01); *H01J 37/321* (2013.01); *H01J 37/32568* (2013.01); *H01J 2237/3341* (2013.01)

(58) Field of Classification Search

None

See application file for complete search history.

(56) References Cited

U.S. PATENT DOCUMENTS 7,846,846 B2 12/2010 Bera et al.
8,119,527 B1 2/2012 Chadrashekar et al.
10,741,407 B2 8/2020 Dole et al.
10,854,431 B2 12/2020 Koshiishi et al.
2009/0000743 A1 1/2009 Iizuka
2013/0122712 A1 5/2013 Kim et al.
2015/0262869 A1* 9/2015 Naik ................ H01L 21/32139 438/643
2015/0348840 A1 12/2015 Bamnolker et al.

(Continued)

OTHER PUBLICATIONS

Narishige et al., "EUV Resist Curing Technique for LWR Reduction and Etch Selectivity Enhancement," Advanced Etch Technology for Nanopatterning, Proc. of SPIE vol. 8328, Mar. 16, 2012, 6 pages.

(Continued)

*Primary Examiner* — Stephanie P Duclair

(74) *Attorney, Agent, or Firm* — Slater Matsil, LLP

(57) ABSTRACT

A method of etching a substrate that includes: loading the substrate into a plasma etch chamber, the substrate including a patterned hard mask layer and an underlying layer, the plasma etch chamber including a chamber part having a surface including a refractory metal, and a first electrode; flowing a process gas including fluorine and carbon into the plasma etch chamber; applying a source power to the first electrode of the plasma etch chamber to generate a plasma in the plasma etch chamber; and etching the underlying layer, the etching including exposing the surface of the chamber part to the plasma to sputter the refractory metal from the surface of the chamber part, and forming a recess in the underlying layer and a conductive polymer layer including the refractory metal over sidewalls of the patterned hard mask layer and the underlying layer, the forming including exposing the substrate to the plasma.

20 Claims, 8 Drawing Sheets

(56) References Cited

U.S. PATENT DOCUMENTS

2018/0327893 A1* 11/2018 Ding .................... C23C 14/35
2022/0084832 A1* 3/2022 Cui .................. H01J 37/32449

OTHER PUBLICATIONS

Carlston, et al., “Effect of Elevated Temperatures on Sputtering Yields,” Physcial Review, vol. 138, No. 3A, May 3, 1965, pp. A 759-A 763.

Institute of Applied Physics, “Sputter Yield Calculator,” https://www.tuwien.at/en/phy/iap/tools/sputter-yield-calculator, Jan. 9, 2026, 2 pages.

Science Direct, “Sputter Yield, an overview; ScienceDirect Topics,” https://www.sciencedirect.com/topics/engineering/sputter-yield, Jan. 9, 2026, 10 pages.

* cited by examiner

PLASMA ETCHING WITH METAL SPUTTERING

CROSS-REFERENCE TO RELATED APPLICATIONS

This application is related to U.S. Non-Provisional Application No. 18,156,917, filed on Jan. 19, 2023, which application is hereby incorporated herein by reference.

TECHNICAL FIELD

The present invention relates generally to methods of processing a substrate and, in particular embodiments, to etch with metal sputtering.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processes.

The semiconductor industry has repeatedly reduced the minimum feature sizes in semiconductor devices to a few nanometers to increase the packing density of components. Accordingly, the semiconductor industry increasingly demands plasma processing technology to provide processes for patterning features with accuracy, precision, and profile control, often at atomic scale dimensions. Meeting this challenge along with the uniformity and repeatability needed for high volume IC manufacturing requires further innovations of plasma processing technology.

SUMMARY

In accordance with an embodiment of the present invention, a method of etching a substrate that includes: loading the substrate into a plasma etch chamber, the substrate including a patterned hard mask layer and an underlying layer, the plasma etch chamber including a chamber part having a surface including a refractory metal, and a first electrode; flowing a process gas including fluorine and carbon into the plasma etch chamber; while flowing the process gas, applying a source power to the first electrode of the plasma etch chamber to generate a plasma in the plasma etch chamber; and etching the underlying layer, the etching including exposing the surface of the chamber part to the plasma to sputter the refractory metal from the surface of the chamber part, and forming a recess in the underlying layer and a conductive polymer layer including the refractory metal over sidewalls of the patterned hard mask layer and the underlying layer, the forming including exposing the substrate to the plasma.

In accordance with an embodiment of the present invention, a method of etching a substrate that includes: loading the substrate into a plasma etch chamber, the substrate including a patterned hard mask layer and an underlying layer, the plasma etch chamber including: a focus ring having a surface including a refractory metal; and a first electrode; flowing a process gas including fluorine and carbon into the plasma etch chamber; while flowing the process gas, applying a source power to the first electrode of the plasma etch chamber to generate a plasma in the plasma etch chamber; and etching the underlying layer, the etching including exposing the surface of the focus ring to the plasma to sputter the refractory metal from the surface of the chamber part, and exposing the substrate to the plasma to form a recess in the underlying layer, where a conductive polymer layer including the refractory metal is deposited over the substrate with a radial gradient such that a concentration of the refractory metal in the conductive polymer layer near an edge portion of the substrate is higher than a central portion of the substrate.

In accordance with an embodiment of the present invention, a method of etching a substrate that includes: loading the substrate into a plasma etch chamber, the substrate including a patterned hard mask layer and an underlying layer, the plasma etch chamber including a top electrode having a surface including a first refractory metal, a bottom electrode, a first radio frequency (RF) power source connected to the bottom electrode, a second radio frequency (RF) power source connected to the bottom electrode, a direct current (DC) voltage source connected to the top electrode, and a focus ring having a surface including a second refractory metal; flowing a process gas including fluorine and carbon into the plasma etch chamber; while flowing the process gas, applying a source power to the bottom electrode using the first RF power source to generate a plasma in the plasma etch chamber; applying a bias power to the bottom electrode using the second RF power source; applying a DC voltage to the top electrode using the DC voltage source; and etching the underlying layer, the etching including sputtering the first and second refractory metals from the top electrode, and exposing the substrate to the plasma to form a recess in the underlying layer, where a conductive polymer layer including the first and second refractory metals is deposited sidewalls of the patterned hard mask layer and the underlying layer.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5A and 5B illustrate cross sectional views of an example substrate during an example high aspect ratio (HAR) patterning process performed using a plasma processing system in accordance with various embodiments, wherein FIG. 5A illustrates an incoming substrate with a patterned hard mask and a material layer, and FIG. 5B illustrates the substrate after reactive ion etching (RIE) accompanied by deposition of a transition metal;

FIGS. 8A-8C illustrate process flow diagrams of the methods of reactive ion etching (RIE) process in accordance with various embodiments, wherein FIG. 8A illustrates an embodiment, FIG. 8B illustrates another embodiment, and FIG. 8C illustrates yet another embodiment.

DETAILED DESCRIPTION OF ILLUSTRATIVE EMBODIMENTS

Figure 1:
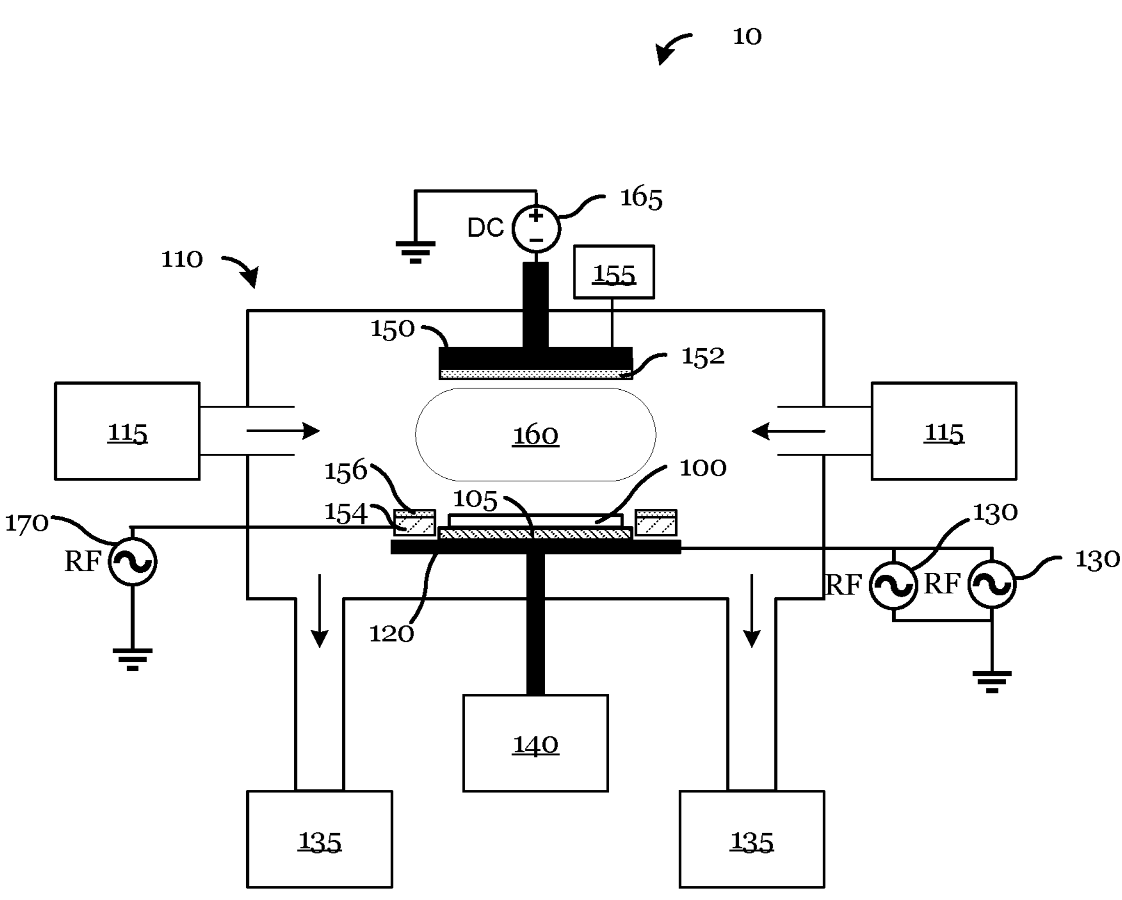
FIG. 1 illustrates an example capacitively coupled plasma (CCP) processing system having a top electrode with a metal coating in accordance with various embodiments.

This application relates to methods of plasma etching that incorporates metal sputtering and deposition, which may be useful for fabrication processes for high capacity three-dimensional (3D) memory devices, such as a 3D-NAND (or vertical-NAND), 3D-NOR, or dynamic random access memory (DRAM) device. The fabrication of such devices may generally require forming conformal, high aspect ratio (HAR) features of a circuit element, for example high aspect ratio contact (HARC) and high aspect ratio trench (HART). Features with aspect ratio (ratio of height of the feature to the width of the feature) higher than 20:1 are generally considered to be high aspect ratio features, and in some cases fabricating a higher aspect ratio such as 100:1 may be desired for advanced 3D semiconductor devices. In HARC/HART etch, satisfactory critical dimension (CD) control may be difficult to achieve due to the limited mask height and etch selectivity of conventional mask materials such as amorphous carbon layer (ACL) and amorphous silicon. For example, bowing is a common issue in HARC/HART etch. While new materials such as metals, metal nitride, metal carbide, and metal silicide may offer a better etch selectivity, the deposition of a thick film and patterning them suitable for a HAR etch process tend to be challenging. Therefore, a simple yet effective HAR process may be desired.

Embodiments of the present application disclose systems and methods of fabricating HAR features by a plasma etch process that incorporates metal sputtering and deposition. Specifically, such plasma etching systems are characterized by at least one chamber part containing a metal element, for example, a refractory metal such as tungsten (W). The metal-containing chamber part may be a top electrode, a focus ring, a chamber wall, or other parts of the plasma processing system, and they may be configured to be sputtered under the presence of a plasma to provide the metal element to the plasma. The sputtered metal may then be deposited over a hard mask and sidewalls of a target layer to be etched to form a passivation layer, which may advantageously provide sidewall protection and improve the critical dimension (CD) profile by reducing bowing. Further, by using a metal-containing focus ring and tuning plasma process conditions, the methods of plasma etching may enable a preferential metal deposition at the edge of a water over the center, which may advantageously improve the edge CD control.

In the following, example plasma etching systems with a metal-containing chamber part are first described referring to FIGS. 1 and 2 for a capacitively coupled plasma (CCP) processing system and inductively coupled plasma (ICP) processing system, respectively. Possible interactions of reactive species during plasma etching in a plasma processing chamber, with and without metal sputtering from the chamber part, are then described referring to FIGS. 3 and 4. Subsequently, the improvement of CD profile with minimal bowing by the methods is described referring to FIGS. 5A-5B and 6. The improvement of edge CD control is further described referring to FIG. 7. Example process flow diagrams are illustrated in FIG. 8A-8C. All figures in this disclosure are drawn for illustration purpose only and not to scale, including the aspect ratios of features.

FIG. 1 illustrates an example capacitively coupled plasma (CCP) processing system 10 in accordance with various embodiments.

As illustrated in FIG. 1, the CCP processing system 10 comprises a plasma processing chamber 110, and a substrate 100 may be placed on a substrate holder 105. In various embodiments, the substrate 100 may be a part of, or including, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

One or more process gases may be introduced into the plasma processing chamber 110 by a gas delivery system 115. The gas delivery system 115 may comprise multiple gas flow controllers to control the flow of multiple gases into the plasma processing chamber 110. In some embodiments, optional center/edge splitters may be used to independently adjust the gas flow rates at the center and edge of the substrate 100. Further, in one embodiment, the gas delivery system 115 may have a special showerhead configuration positioned at the top of the plasma processing chamber 110. For example, the gas delivery system 115 may be integrated with a top electrode 150, having a showerhead configuration on the top electrode 150, covering the entirety of the substrate 100, including a plurality of appropriately spaced gas inlets. Alternatively, gas may be introduced through dedicated gas inlets of any other suitable configuration. The plasma processing chamber 110 may further be equipped with one or more sensors such as pressure monitors, gas flow monitors, and/or gas species density monitors. The sensors may be integrated as a part of the gas delivery system 115 in various embodiments.

In FIG. 1, the plasma processing chamber 110 is a vacuum chamber and may be evacuated using one or more vacuum pumps 135, such as a single stage pumping system or a multistage pumping system (e.g. a mechanical roughing pump combined with one or more turbomolecular pumps). In order to promote even gas flow during plasma processing, gas may be removed from more than one gas outlet or location in the plasma processing chamber 110 (e.g., on opposite sides of the substrate 100).

In various embodiments, the substrate holder 105 may be integrated with, or a part of, a chuck (e.g., a circular electrostatic chuck (ESC)) positioned near the bottom of the plasma processing chamber 110, and connected to a bottom electrode 120. The surface of the chuck or the substrate holder 105 may be coated with a conductive material (e.g., a carbon-based or metal-nitride based coating). The substrate 100 may be optionally maintained at a desired temperature using a temperature sensor and a heating element connected to a first temperature controller 140. In certain embodiments, the temperature sensor may comprise a thermocouple, a resistance temperature detector (RTD), a thermistor, or a semiconductor based integrated circuit. The heating element may for example comprise a resistive heater in one embodiment. In addition, there may be a cooling element such as a liquid cooling system coupled to the first temperature controller 140. The bottom electrode 120 may be connected to one or more RF power sources 130 to generate a plasma 160 in the plasma processing chamber 110. As illustrated in FIG. 1, more than one RF power sources may be used, for example, to provide a high frequency RF power (HF) and a low frequency RF power (LF) at the same time. In various embodiments, the HF may be used for plasma and radical generation the LF may be used for ion acceleration in a sheath of the plasma 160 over the substrate 100 that enables plasma etching on the substrate 100. In certain embodiments for a CCP processing system, the frequency of the HF may range from 27 MHz to 150 MHz, and that of the LF may range from 400 kHz to 13 MHz. The RF power sources 130 may be used to supply continuous wave (CW) or pulsed RF power to sustain the plasma 160. The plasma 160, shown between a top electrode 150 and the bottom electrode 120, exemplifies direct plasma generated close to the substrate 100 in the plasma processing chamber 110.

In various embodiments, a RF pulsing at a kHz range may be used to power the plasma 160. Using the RF pulsing may help generating high energetic ions (>keV) in the plasma 160 for the plasma etch process, while reducing a charging effect. The charging effect during a process is a phenomenon where electrons build charge on insulating materials creating a local electric field that may steer positive ions to the sidewalls and cause a lateral etching. Therefore, fine tuning the power conditions of the plasma etch process may also be important to minimize the widening of critical dimension (CD) of the high aspect ratio (HAR) feature. In certain embodiments, a moderate duty ratio between 10% and 100% may be used. In one embodiment, a bias power of 18 kW may be pulsed at a frequency of 5 kHz with a duty ratio of 60%.

Further illustrated in FIG. 1, the top electrode 150 may be a conductive circular plate inside the plasma processing chamber 110 near the top. In various embodiments, the top electrode 150 may be connected to a to direct current (DC) voltage source 165 of the CCP processing system 10. Combined with the RF power from the RF power sources 130, the DC voltage is used to generate a DC superimposed RF plasma in the plasma processing chamber 110. In FIG. 1, the DC voltage may be supplied to the top electrode 150. In another embodiment, the DC voltage may be supplied to the bottom electrode 120. In various embodiments, the DC voltage may advantageously be adjusted to tune the degree of metal sputtering and thereby the concentration of the metal elements in the plasma 160.

The DC voltage supplied by the DC voltage source 165 can range from positive to negative. A negative DC voltage at the top electrode 150 may advantageously adjust (e.g., increase) the average ion energy of species of the plasma 160. In various embodiments, the DC voltage $V_{DC}$ coupled to the top electrode 150 may be in the range of 0 V to about 3000 V. In one embodiment, the DC voltage $V_{DC}$ coupled to the top electrode 150 may be about −200 V. In further embodiments, instead of the DC voltage source 165, another RF power source may be used and configured to provide a RF power to the top electrode 150. In one or more embodiments, the frequency for the RF power to the top electrode 150 may range from 400 kHz to 13 MHz.

In various embodiments, the CCP processing system 10 is particularly characterized by the top electrode 150 comprising a metal, for example, with a metal-containing coating 152. During a plasma processing such as reactive ion etching (RIE) using the CCP processing system 10, the metal of the metal-containing coating 152 may advantageously be sputtered by ion bombardment resulting in the plasma 160 containing the metal. This metal sputtered into the plasma 160 may then be deposited to form a sidewall passivation layer, which may enhance the CD control, as further described referring to FIGS. 3, 4, 5A-5B, and 6. In various embodiments, the metal may be a transition metal. In certain embodiments, the metal may be a refractory metal such as tungsten (W). Examples of the metals useful for the metal-containing coating 152 further include titanium (Ti) and tantalum (Ta), but other metals may also be used. Generally, elements which exhibit etch resistance, when deposited from the plasma 160, better than the etch mask used in the process are useful and preferred. The metal-containing coating 152 may be in pure metal form in certain embodiments, but in other embodiments, it may be metal carbide (e.g., WC), metal nitride (e.g., WN), metal silicide ($WSi_x$), or other metal compounds. Further, the metal-containing coating 152 may also comprise a thin layer of an oxide on surface.

The top electrode 150 may in one or more embodiments, be connected to a second temperature controller 155 configured to control the temperature of the top electrode 150 and the metal-containing coating 152. The second temperature controller 155 may further comprise or be coupled to a temperature sensor and a heating element. In certain embodiments, the temperature sensor may comprise a thermocouple, a resistance temperature detector (RTD), a thermistor, or a semiconductor based integrated circuit. The heating element may for example comprise a resistive heater in one embodiment. In addition, there may be a cooling element such as a liquid cooling system coupled to the second temperature controller 155. Since the metal sputtering may depend on the temperature of a target, controlling the temperature of the top electrode 150 may be useful in adjusting the degree of metal sputtering. For example, increasing the temperature of the metal-containing coating 152 may enhance the metal sputtering by the plasma 160.

Although the metal-containing coating 152 covers the bottom surface of the top electrode 150 in FIG. 1, in alternate embodiments, the metal may be incorporated in a chamber part of the plasma processing chamber 110 in any reasonable fashion as long as the metal sputtering may be enabled. Accordingly, the metal may be incorporated by, for example, the top electrode 150 entirely made of, plated with, brazed with, or deposited with the metal, metal carbide, metal nitride, metal silicide, or other metal compounds.

In various embodiments, the CCP processing system 10 may further comprise a focus ring 154 positioned over the bottom electrode 120 to surround the substrate 100. The focus ring 154 may advantageously maintain and extend the uniformity of the plasma 160 to achieve process consistency at the edge of the substrate 100. In various embodiments, the focus ring 154 may have a width of a few cm. In various embodiments, there may be a gap for mechanical clearance between the circumference of the substrate 100 and the focus ring 154. In certain embodiments, the gap may be hundreds of microns to a few mm. In various embodiments, the focus ring 154 may comprise a dielectric material with a desired dielectric constant. In certain embodiments, the focus ring 154 may comprise silicon. Some examples of silicon-based focus ring may comprise silicon, silicon oxide, doped silicon (e.g., boron-doped, nitrogen-doped, and phosphorous-doped), or silicon carbide. Alternatively, in some embodiments, the focus ring may comprise a carbon-based material. In one or more embodiments, the focus ring 154 may be coupled to bias power via the bottom electrode 120 or a separate RF power source. An additional temperature controller may also be present configured to separately control the temperature of the focus ring 154.

In certain embodiments, similar to the top electrode 150 as described above, the focus ring 154 may also comprise a focus ring metal-containing coating 156 on the surface. The metal of the focus ring metal-containing coating 156 may be utilized as an additional source for metal for the metal sputtering during a plasma process. The metal used in the focus ring metal-containing coating 156 may be tungsten (W), titanium (Ti), tantalum (Ta), or other metals. In one embodiment the metal of the focus ring metal-containing coating 156 and the metal of the metal-containing coating 152 may be the same, but in another embodiment, they may be different. The metal of the focus ring metal-containing coating 156 may be in pure metal form in certain embodiments, but in other embodiments, it may be metal carbide (e.g., WC), metal nitride (e.g., WN), metal silicide ($WSi_x$), or other metal compounds. In one or more embodiments, the focus ring 154, instead of having the focus ring metal-containing coating 156, may be entirely made of, plated with, brazed with, or deposited with the metal, metal carbide, metal nitride, metal silicide, or other metal compounds.

As illustrated in FIG. 1, the focus ring 154 may be connected to a RF power source 170 configured to apply a RF bias to the focus ring 154 in one embodiment. In another embodiment, a DC voltage source may be used instead of a RF power source. Applying a bias to the focus ring 154 may advantageously improve the uniformity of the plasma 160 in the plasma processing chamber 110 and also adjust the degree of the metal sputtering, particularly from the surface of the focus ring metal-containing coating 156 and/or the focus ring 154. The first temperature controller 140 may also be configured to control the temperature of the focus ring 154 in certain embodiments. Controlling the temperature of the focus ring metal-containing coating 156, similar to the top electrode 150, may be useful in adjusting the degree of metal sputtering.

Although the incorporation of the metal to both the top electrode 150 and the focus ring 154 is described above referring to FIG. 1, in certain embodiments, only the top electrode 150 or the focus ring 154 may comprise a metal-containing coating. Further, any other suitable chamber parts, including but not limited to a chamber wall, may also be fabricated to include the metal on or near their surface and utilized as a metal source for metal sputtering. Further, in one or more embodiments, the incorporation of the metal to the CCP processing system 10 may be achieved by introducing a designated sputter target part to the system instead of, or in addition to, the top electrode 150 or the focus ring 154. Plasma exposure to the designated sputter target may independently controlled, for example, with a shutter, to advantageously enable/disable metal sputtering.

Figure 2:
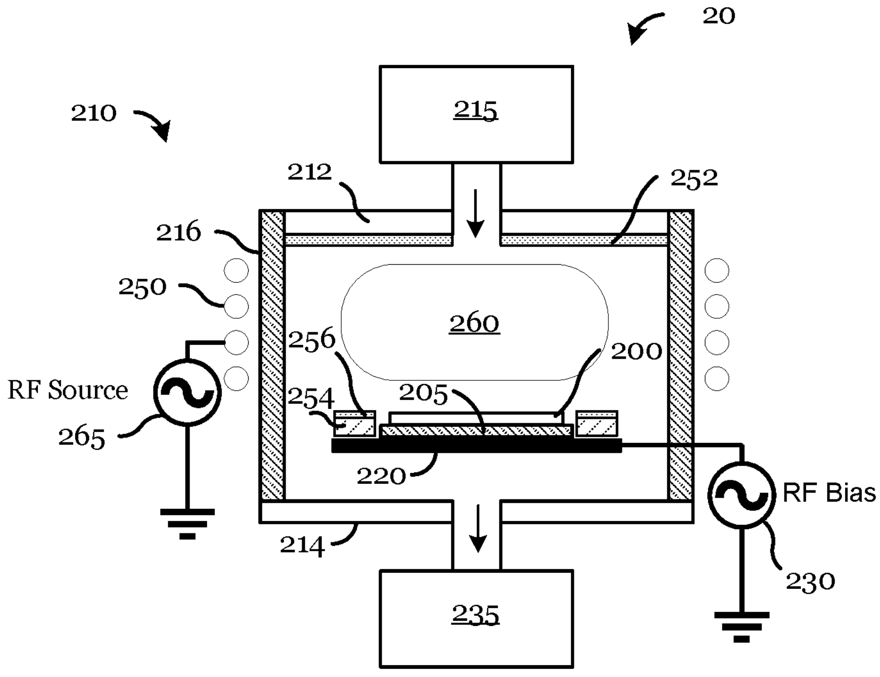
FIG. 2 illustrates an example inductively coupled plasma (ICP) processing system having a top plate with a metal coating in accordance with alternate embodiments.

FIG. 2 illustrates an example inductively coupled plasma (ICP) processing system 20 in accordance with alternate embodiments. For illustration purpose, some parts of the ICP processing system 20 that may be in common with the CCP processing system 10 illustrated in FIG. 1 are omitted (e.g., the first temperature controller 140 and the RF power source 170) and not repeated below.

In FIG. 2, the ICP processing system 20 comprises a plasma processing chamber 210 configured to sustain a plasma 260 directly above a substrate 200 loaded onto a substrate holder 205. A focus ring 254 may be positioned to surround the substrate 200. A process gas may be introduced to the plasma processing chamber 210 through a gas inlet connected to a gas flow control system 215 and may be pumped out of the plasma processing chamber 210 through a gas outlet connected to a vacuum pump 235. The gas flow control system 215 may comprise various components such as high pressure gas canisters, valves (e.g., throttle valves), pressure sensors, gas flow sensors, vacuum pumps, pipes, and electronically programmable controllers. A bottom electrode 220 may be connected to an RF bias power source 230. For ICP configuration, a top electrode 250 may be a conductive helical coil electrode located outside the plasma processing chamber 210, coiled around a dielectric sidewall 216. The top electrode 250 may be connected to a RF source power source 265. As further illustrated in FIG. 2, the gas inlet is an opening in a top plate 212 and the gas outlet is an opening in a bottom plate 214. The top plate 212 and bottom plate 214 may be conductive and electrically connected to the system ground (a reference potential).

In various embodiments, the ICP processing system 20 is particularly characterized by the top plate 212 comprising a metal, for example, with a metal-containing coating 252 inside the plasma processing chamber 210. Unlike the prior embodiments of the CCP processing system 10, the top electrode 250 is located outside the plasma processing chamber 210. Accordingly, the metal-containing chamber part for metal sputtering may be, for example, the top plate 212 rather than the top electrode 250. The metal-containing coating 252 may function as a metal source for the metal sputtering during a plasma processing such as reactive ion etching (RIE) using the ICP processing system 20. In various embodiments, the metal may be tungsten (W), titanium (Ti), tantalum (Ta), or other metals. The metal-containing coating 252 may be in pure metal form in certain embodiments, but in other embodiments, it may be metal carbide (e.g., WC), metal nitride (e.g., WN), metal silicide ($WSi_x$), or other metal compounds.

Similar to the prior embodiments, in certain embodiments, as illustrated in FIG. 2, the focus ring 254 may also comprise a focus ring metal-containing coating 256, which may serve an additional metal source for metal sputtering. In one or more embodiments, only the top plate 212 or the focus ring 254 may comprise a metal-containing coating. Further, any other suitable chamber parts may also be fabricated to include the metal on or near their surface and utilized as a metal source for metal sputtering.

Although not specifically illustrated in FIG. 2, the ICP processing system 20 may further comprise any additional components useful for the plasmas processing such as temperature controllers for the substrate 200, the bottom electrode 220, and/or the focus ring 254 and a RF power source for the focus ring 254. In one or more embodiments, the ICP processing system 20 may further comprise a direct current (DC) voltage source or a RF power source configured to provide a DC voltage or a RF power to a chamber part (e.g., the top plate 212) that is isolated from the primary RF system to generate the plasma 260. Such additional voltage or power sources may advantageously tune the degree of metal sputtering and thereby the concentration of the metal elements in the plasma 260.

The configurations of the plasma etching systems (e.g., the CCP processing system 10 in FIG. 1 and the ICP processing system 20 in FIG. 2) described above are for example only. In alternative embodiments, various alternative configurations may be used for a plasma processing system that incorporates a metal-containing chamber part for metal sputtering. In an alternate embodiment for an ICP processing system, a conductive helical coil electrode (e.g., the top electrode 250 in FIG. 2) may be located above the top plate 212 rather than the sidewall 216. In this configuration, the top plate 212 may be made of a dielectric material to allow the electromagnetic field to be coupled to the plasma 260 in the plasma processing chamber 210. Accordingly, unlike FIG. 2, the focus ring metal-containing coating 256 may be applied to the sidewall 216 rather than the top plate 212. In another example, the plasma processing system may be a resonator such as a helical resonator. Further, microwave plasma (MW) or other suitable systems may be used. Pulsed RF power sources and pulsed DC voltage sources may also be used in some embodiments (as opposed to continuous wave RF power sources). In various embodiments, the RF power, chamber pressure, substrate temperature, gas flow rates and other plasma process parameters may be selected in accordance with the respective process recipe.

Figures 3, 4:
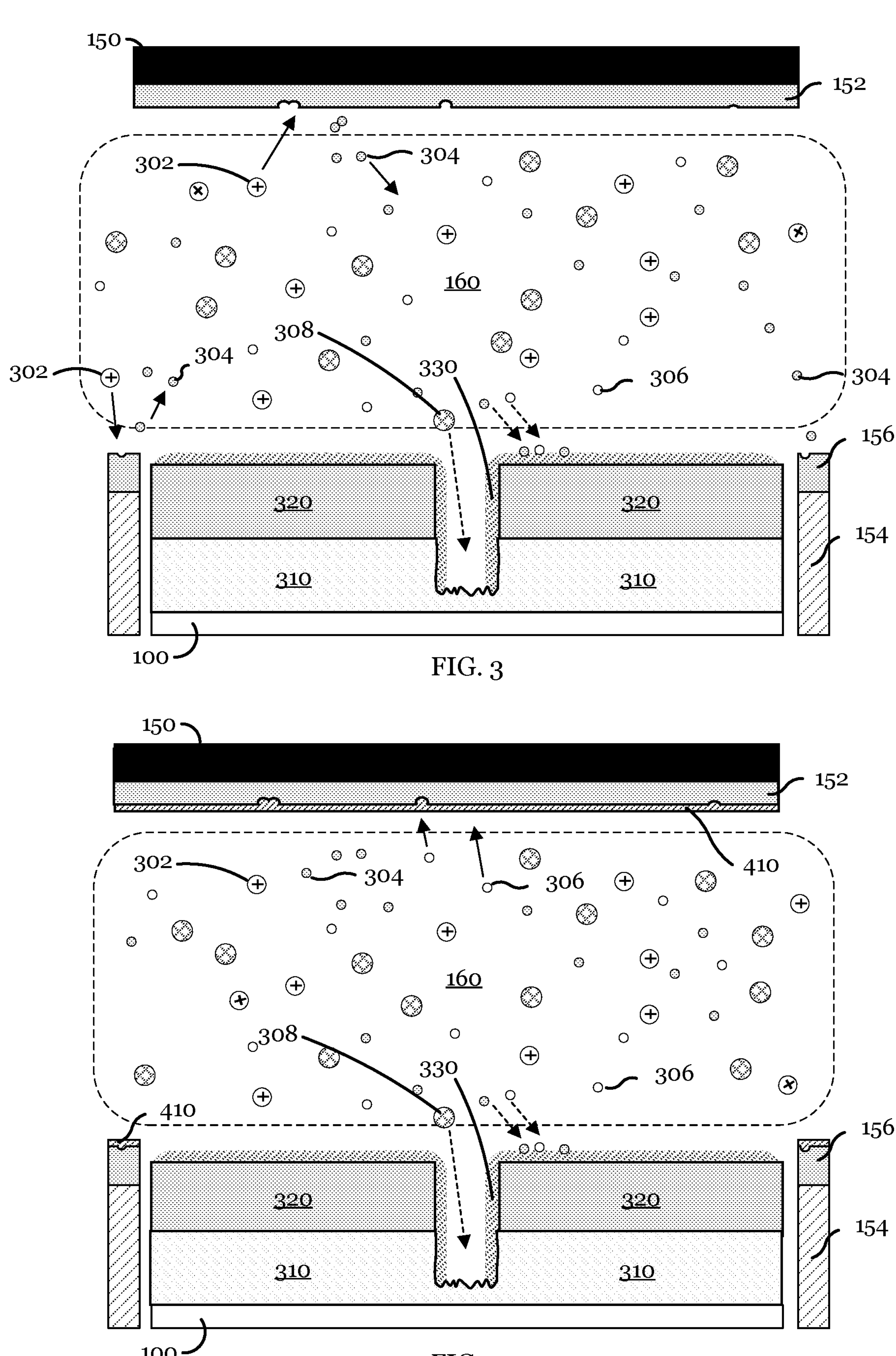
FIG. 3 illustrates a cross sectional view of a top electrode of a CCP processing system and a substrate positioned in an etch chamber in accordance with various embodiments, wherein a plasma in the etch chamber causes metal sputtering/deposition and reactive ion etching (RIE) over the substrate.
FIG. 4 illustrates a cross sectional view of a top electrode of a CCP processing system and a substrate positioned in an etch chamber in accordance with various embodiments, wherein a plasma in the etch chamber causes reactive ion etching (RIE) over the substrate without metal sputtering.

In various embodiments, a plasma etching process such as reactive ion etching (RIE) may comprise controlling the plasma condition to enable/disable the metal sputtering from the metal-containing chamber part, as further described referring to FIGS. 3 and 4. Although FIGS. 3 and 4 illustrates a CCP processing system, the description regarding the metal sputtering and deposition may be applicable to various other plasma systems.

FIG. 3 illustrates a cross sectional view of a top electrode 150 of a CCP processing system and a substrate 100 positioned in a etch chamber in accordance with various embodiments, wherein a plasma 160 in the etch chamber causes metal sputtering/deposition and reactive ion etching (RIE) over the substrate 100.

In FIG. 3, a material layer 310 may be formed over the substrate 100. In various embodiments, the material layer 310 may be a target layer that is to be patterned into one or more high aspect ratio (HAR) features. In certain embodiments, the HAR feature being etched into the material layer 310 may be a contact hole, slit, or other suitable structures comprising a recess. In one embodiment, the material layer 310 may be a silicon oxide layer. The material layer 310 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the material layer 310 has a thickness between 0.1 μm and 100 μm.

Still referring to FIG. 3, a patterned layer 320 is formed over the material layer 310. In various embodiments, the patterned layer 320 may comprise any material useful to enable patterning of the material layer 310 by subsequent patterning processes. In various embodiments, the patterned layer 320 may comprise a photoresist, an organic dielectric layer (ODL), or amorphous carbon layer (ACL). The patterned layer 320 may comprise a hard mask, including but not limited to, amorphous silicon, silicon oxide, silicon nitride, or a metal-based hard mask. In one or more embodiments, the patterned layer 320 may be a layer stack comprising multiple layers, for example, a tri-layer stack commonly used for a photolithographic process. The patterned layer 320 may be formed by first depositing a hard mask layer using, for example, an appropriate spin-coating technique or a vapor deposition technique such as chemical vapor deposition (CVD), physical vapor deposition (PVD), atomic layer deposition (ALD), as well as other plasma processes such as plasma enhanced CVD (PECVD) and other processes. The deposited hard mask layer may then be patterned using a lithography process and an anisotropic etch process. The relative thicknesses of the patterned layer 320 and the material layer 310 may have any suitable relationship. For example, the patterned layer 320 may be thicker than the material layer 310, thinner than the material layer 310, or the same thickness as the material layer 310. In one embodiment, the patterned layer 320 has a thickness between 0.1 μm and 10 μm.

The patterned layer 320 and/or the material layer 310 may be collectively considered as a part of the substrate 100. Further, the substrate 100 may also comprise other layers. For example, for the purpose of patterning the layer, a tri-layer structure comprising a photoresist layer, SiON layer, and optical planarization layer (OPL) may be present.

Fabricating the HAR feature in the material layer 310 may be performed by a plasma etch process using a combination of process gases to generate the plasma 160. In various embodiments, the process gas may comprise any reasonable gas that may provide an etchant for the plasma etch process, for example a halogen. In certain embodiments, the process gas may comprise fluorocarbon or hydrofluorocarbon. Examples of such process gases include tetrafluoromethane ($CF_4$), trifluoromethane ($CHF_3$), difluoromethane ($CH_2F_2$), octafluoropropane ($C_3F_8$), hexafluoropropylene ($C_3F_6$), perfluorobutane ($C_4F_{10}$), octafluorocyclobutane ($C_4F_8$), octafluoro-2-butene ($C_4F_8$), perflenapent ($C_5F_{12}$), hexafluorobutadiene ($C_4F_6$), hexafluoro-2-butyne ($C_4F_6$), and hexafluorocyclobutene ($C_4F_6$). In certain embodiments, other gases such as a noble gas and/or a balancing agent may also be added. For example, in certain embodiments, argon (Ar) and dioxygen ($O_2$) may be included as the noble gas and the balancing agent, respectively.

Accordingly, in certain embodiments, the plasma 160 may comprises positively charged species 302 (e.g., $Ar^+$), carbon species 306, and fluorine species 308 as illustrated in FIG. 3. Here, the sputtering of the metal may be enabled when the positively charged species 302 is provided sufficient ion bombardment energy. In various embodiments, the positively charged species 302 impinges on the surface of the metal-containing chamber parts (e.g., the metal-containing coating 152 of the top electrode 150, the focus ring metal-containing coating 156 of the focus ring 154, or both). As indicated by solid arrows in FIG. 3, metal species 304 may be sputtered into the plasma from the metal-containing chamber parts.

Various process parameters may be utilized to enable and control the metal sputtering. For example, increasing the DC voltage applied to the top electrode 150 may increase the ion bombardment energy of the positively charged species 302 and thereby their sputtering ability. In addition, the degree of metal sputtering may also depend on the temperature of the metal-containing coating 152, where a higher temperature leads to a greater amount of sputtering. A precise, local temperature control may therefore be utilized to control the metal sputtering. Other parameters such as process time, gas composition (e.g., inert gas concentration), chamber pressure, RF source power, and RF bias power may also impact the metal sputtering, and thus may be selected accordingly in a process recipe.

Still referring to FIG. 3, with the plasma 160 enabling reactive ion etching (RIE), a recess is formed in the material layer 310 according to the pattern of the patterned layer 320. In various embodiments, the fluorine species 308 may function as the primary etchant. During this etching, a metal-containing conductive polymer layer 330 may be formed on the surface of the patterned layer 320 and sidewalls of the material layer 310 in the recess, which may advantageously function as a sidewall passivation layer. Further, the metal-containing conductive polymer layer 330 may also provide a conductive path for charges carried by ions in the plasma, or it may provide a better conductivity along the sidewalls of the material layer 310 compared with a polymer layer without any metal.

In various embodiments, the metal-containing conductive polymer layer 330 may be formed through deposition of the metal species 304 and the carbon species 306, but in other embodiments, other species may be involved. In certain embodiments, the metal-containing conductive polymer layer 330 may comprise metals, metal nitride, metal carbide, or metal silicide. In one or more embodiments, the metal-containing conductive polymer layer 330 may comprise a metal carbide, for example, tungsten carbide (WC), which exhibits high mechanical and chemical stability. Accordingly, the metal-containing conductive polymer layer 330 may advantageously provide superior sidewall passivation compared with a passivation layer that does not contain any metal.

While these metal-containing materials may be potentially used as hard mask itself (e.g., the patterned layer 320) to offer excellent etch selectivity, depositing a sufficiently thick film and patterning these metal-containing material as hard mask may be challenging. In this approach, along with new materials, completely new techniques for deposition and for patterning may have to be developed. In contrast, various embodiments of this disclosure integrates a thin film of the metal-containing material (e.g., as the metal-containing conductive polymer layer 330) with conventional hard mask materials (e.g., amorphous carbon and/or amorphous silicon), which are significantly easier to process and pattern as hard mask. As a result, the etch performance may be substantially improved with minimal additional steps while not requiring a completely new hard mask. Further, providing a metal-containing chamber part to the plasma processing system, the methods may not require to include any metal element in the process gas. In various embodiments, the conventional process gas such as fluorocarbon for HAR patterning processes may be utilized with no to little modification.

FIG. 4 illustrates a cross sectional view of a top electrode 150 of a CCP processing system and a substrate 100 positioned in a etch chamber in accordance with various embodiments, wherein a plasma 160 in the etch chamber causes reactive ion etching (RIE) over the substrate 100 without metal sputtering. The structure of the substrate 100 and species of the plasma 160 are the same as those illustrated in FIG. 3 and thereby will not be repeated.

In FIG. 4, the condition of the plasma 160 may be changed from that of FIG. 3 to disable the metal sputtering while maintaining the etching ability. As illustrated in FIG. 4, the metal sputtering by ion bombardment may be disabled by the formation of a deposition layer 410, for example, comprising carbon. In various embodiments, the deposition layer 410 may comprise carbon materials formed through the deposition of the carbon species 306 of the plasma 160. The deposition layer 410 may passivate and protect the metal-containing coating 152 and the focus ring metal-containing coating 156 from being sputtered by ions such as the positively charged species 302 (e.g., $Ar^+$). In one or more embodiments, this no-sputtering condition may be realized by turning off or decreasing the DC voltage $V_{dc}$ applied to the top electrode 150, which reduces the ion bombardment energy of species of the plasma 160. In addition, other process parameters may be controlled to disable the metal sputtering. In one embodiment, the metal-containing coating 152 may be cooled. In certain embodiments, the process conditions may disable the metal sputtering without the formation of the deposition layer 410.

As described above referring to FIGS. 3 and 4, the plasma process conditions used for etching the material layer 310 may or may not enable the metal sputtering from the metal-containing chamber part (e.g., the metal-containing coating 152 of the top electrode 150, the focus ring metal-containing coating 156 of the focus ring 154, or both), primarily depending on the ion bombardment energy provided to the plasma 160. Generally, higher ion bombardment energy may be desired for a faster etch rate and enable metal sputtering, but it may impair the etch selectivity and the formation of the metal-containing conductive polymer layer 330. Accordingly, addressing this trade-off, the plasma etching process in various embodiments may be a multi-step process employing multiple plasma conditions, for example, a cyclic process repeating sputtering and non-sputtering conditions.

Further, in various embodiments, the process conditions and process recipe may be selected to achieve a desired thickness of the metal-containing conductive polymer layer 330. While the presence of the metal-containing conductive polymer layer 330 is beneficial in improving the CD control and reduce bowing, excessive deposition of the metal-containing conductive polymer layer 330 may cause undesired critical dimension (CD) shrinkage and/or clogging issues. Accordingly, process parameters such as process time, gas composition (e.g., inert gas concentration), chamber pressure, RF source power, and RF bias power may be selected to balance the degree of metal deposition to form the metal-containing conductive polymer layer 330 as well as the metal sputtering.

Figure 5A:
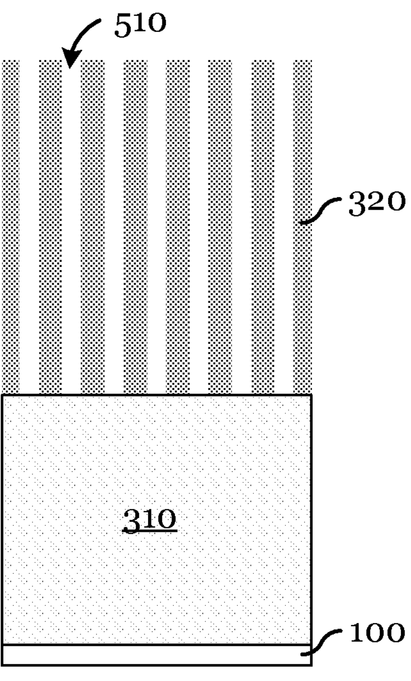
Figure 5B:
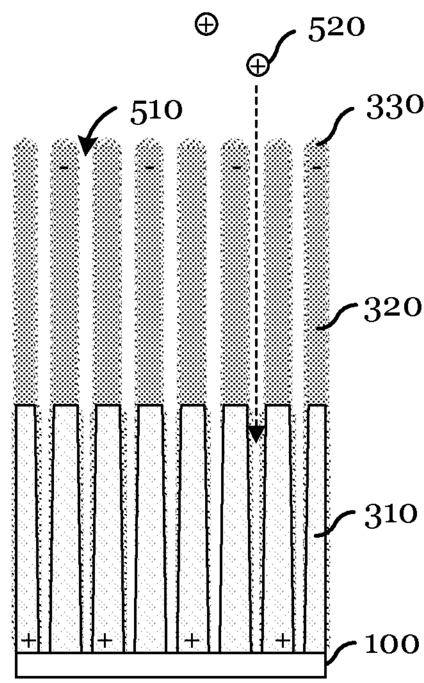

FIGS. 5A and 5B illustrate cross sectional views of an example substrate 100 during an example high aspect ratio (HAR) patterning process using a plasma processing system in accordance with various embodiments.

FIG. 5A illustrates a cross sectional view of an incoming substrate 100 with a patterned layer 320 and a material layer 310, similar to those illustrated in FIGS. 3 and 4, and thus will not be repeated in detail. The material layer 310 is to be patterned to form HAR features that may be useful in high capacity three-dimensional (3D) memory devices, such as a 3D-NAND (or vertical-NAND), 3D-NOR, or dynamic random access memory (DRAM) device. These devices typically require forming conformal, high aspect ratio contact holes (HARC) or trenches (HART). In certain embodiments, the material layer 310 is a layer stack comprising multiple layers, for example, alternating oxide layers and nitride layers. As illustrated in FIG. 5A, the patterned layer 320 is characterized by having recesses 510.

FIG. 5B illustrates a cross sectional view of the substrate 100 after reactive ion etching (RIE) with CD control with sidewall passivation.

The plasmas etch process may be a single step process or a multi-step process including a cyclic process, and may be fluorocarbon or hydrofluorocarbon-based process as described above. In FIG. 5B, the HAR feature is being formed by extending the recesses 510 into the material layer 310 by the plasma etch process. As described referring to FIGS. 3 and 4, since the plasma processing system is capable of metal sputtering from the metal-containing chamber part, a highly anisotropic plasma etch with excellent CD control may be achieved. The sidewalls of the patterned layer 320 and the material layer 310 may be protected during the plasma etch process by a metal-containing conductive polymer layer 330 comprising the metal (e.g., metal carbide). As a result, the recesses 510 may be extended straight without substantial lateral etching.

Further, the metal-containing conductive polymer layer 330 may also provide a conductive path for charges carried by ions in the plasma, and therefore charge buildup during the plasma etch process may be suppressed. This effect may advantageously improve the anisotropy of the plasma etch process by helping positively charged etchant species 520 travel with less deflecting in their trajectory as illustrated in FIG. 5B.

Once the plasma etch process to form the HAR feature is completed, appropriate subsequent fabrication steps may be followed accordingly to, for example, a conventional process recipe. Such steps may be including, but not limited to, a removal of the remaining hard mask, a metallization, a staircase etch to form a staircase structure in the material layer 310 in case of fabricating a 3D NAND device.

Figure 6:
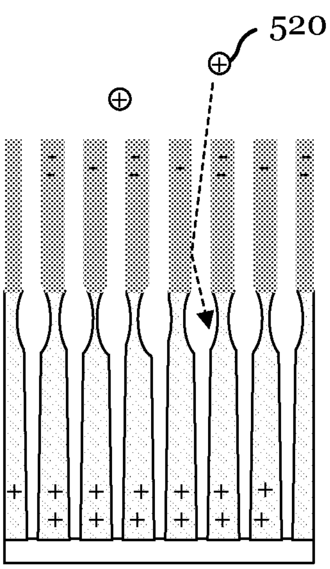
FIG. 6 illustrates a cross sectional view of an example substrate during an example high aspect ratio (HAR) patterning process with insufficient sidewall passivation resulting in bowing issues and poor critical dimension (CD) control.

FIG. 6 illustrates a cross sectional view of an example substrate 100 during an example high aspect ratio (HAR) patterning process with insufficient sidewall passivation resulting in bowing issues and poor critical dimension (CD) control.

In contrast to FIG. 5B, as illustrated in FIG. 6, if the sidewalls are not sufficiently passivated, for example, in the absence of the metal element in a passivation layer, the charges may build up and may not be easily relaxed during the plasma etch process. As a result, the positively charged etchant species 520 may more deflected in their trajectory, thus causing lateral etch and bowing issues. Bowing refers to the deviation of a perfectly straight recess from a purely anisotropic profile to a recess having outward curvature. As illustrated in FIG. 6, bowing may generally occur near the top of sidewalls of the etch target (e.g., the material layer 310), and may be caused by the bending of incident ion trajectories of ions used during the plasma etching process. Bowing may result in a widening of the critical dimension of a semiconductor device, and may ultimately cause a collapse of fabricated features. Although various high aspect ratio (HAR) etch methods may provide some degree of sidewall passivation, for example, through a polymeric passivation layer comprising carbon and fluorine, bowing may still occur especially if the etch process time is elongated to increase the aspect ratio of the feature. As described above referring to FIGS. 5A-5B, this potential bowing issue may advantageously be prevented by the methods of plasma etching that incorporates metal sputtering and deposition.

Figure 7:
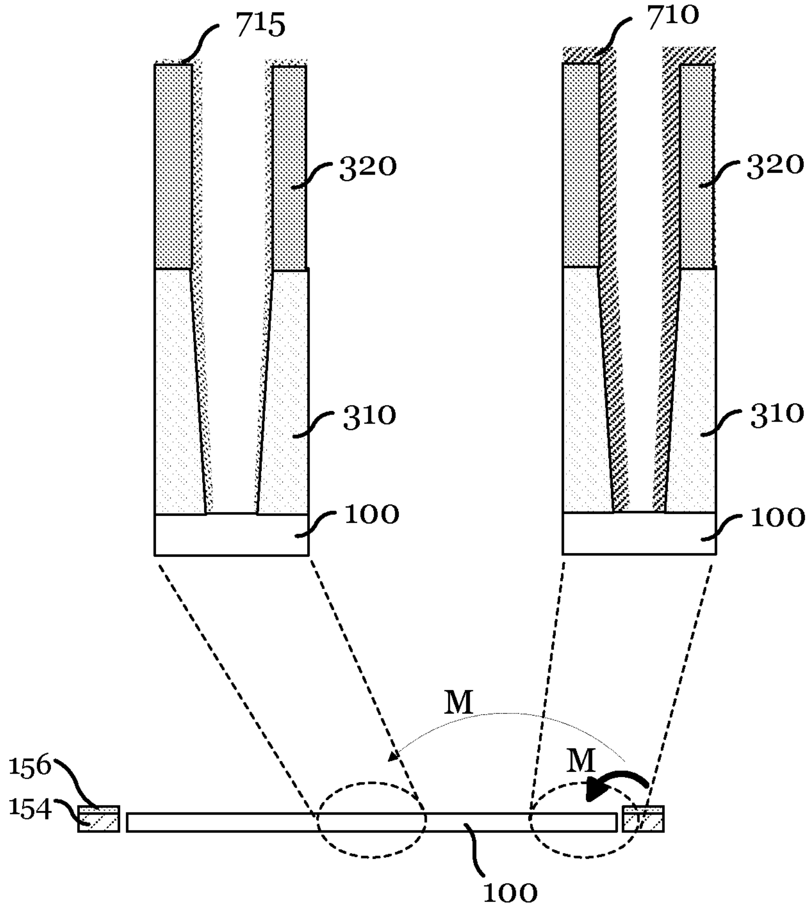
FIG. 7 illustrates cross sectional views of an example substrate at the center and the edge during an example high aspect ratio (HAR) patterning process with a radial gradient of a transition metal in accordance with various embodiments.
Figure 8A:
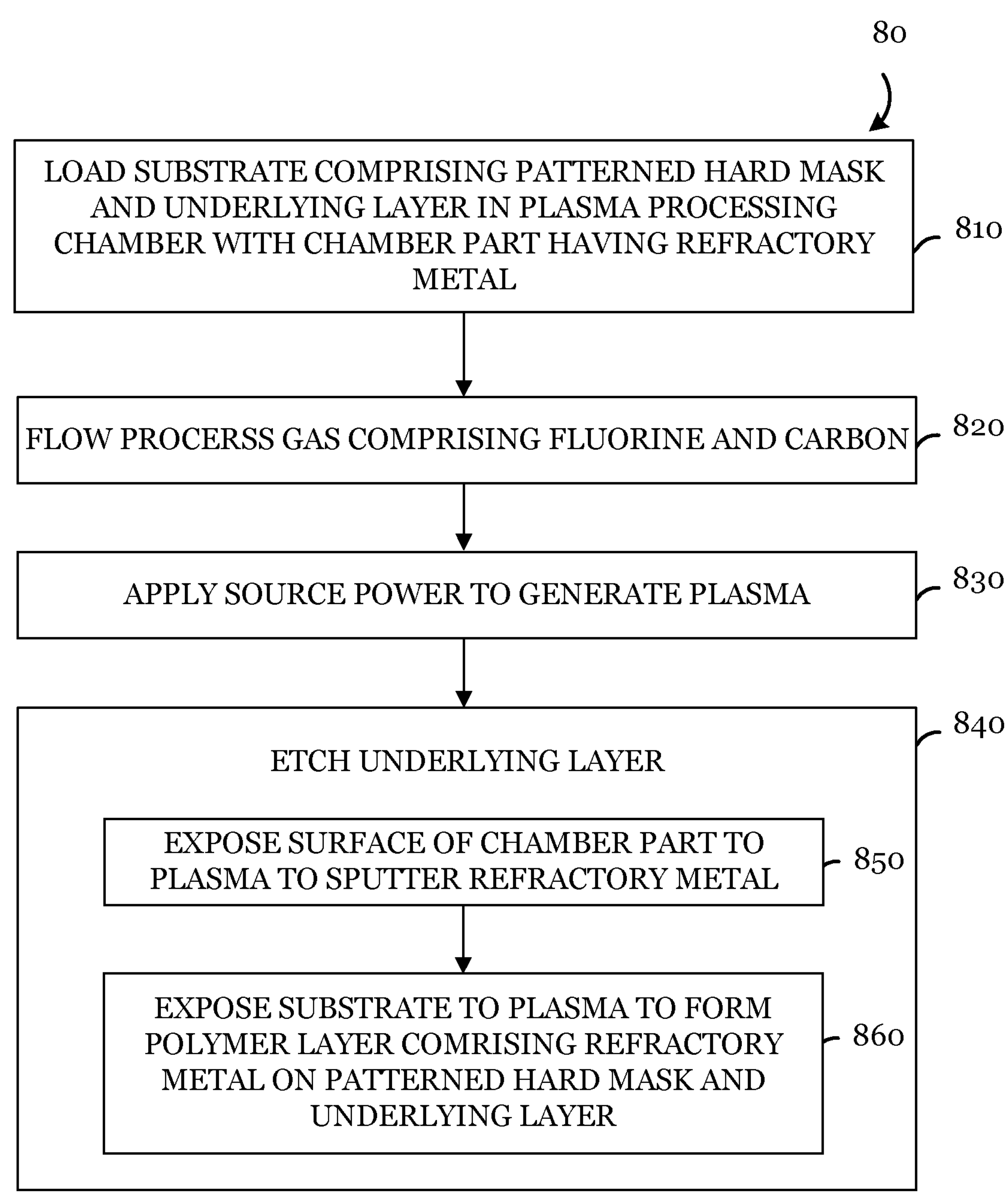
Figure 8B:
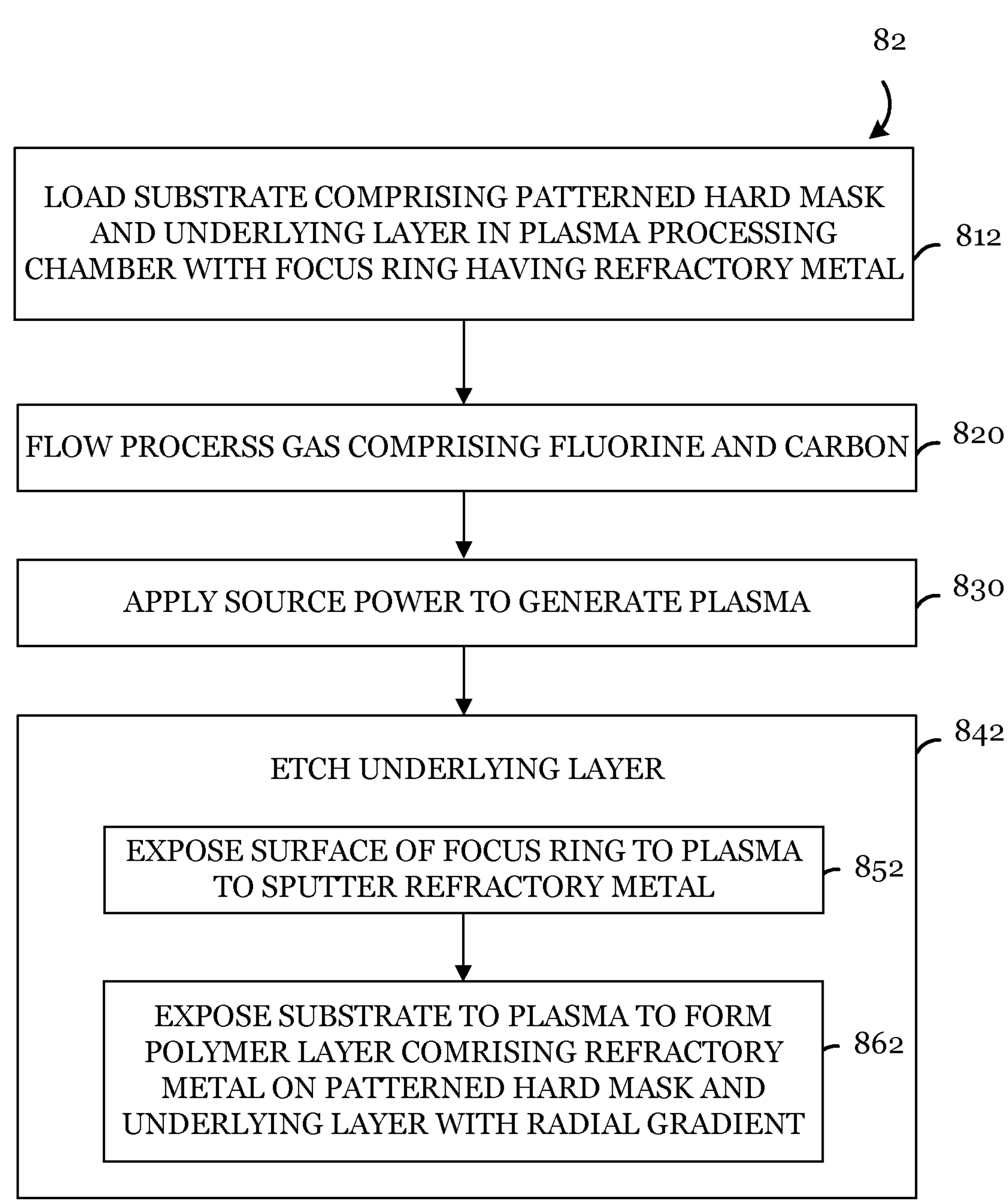
Figure 8C:
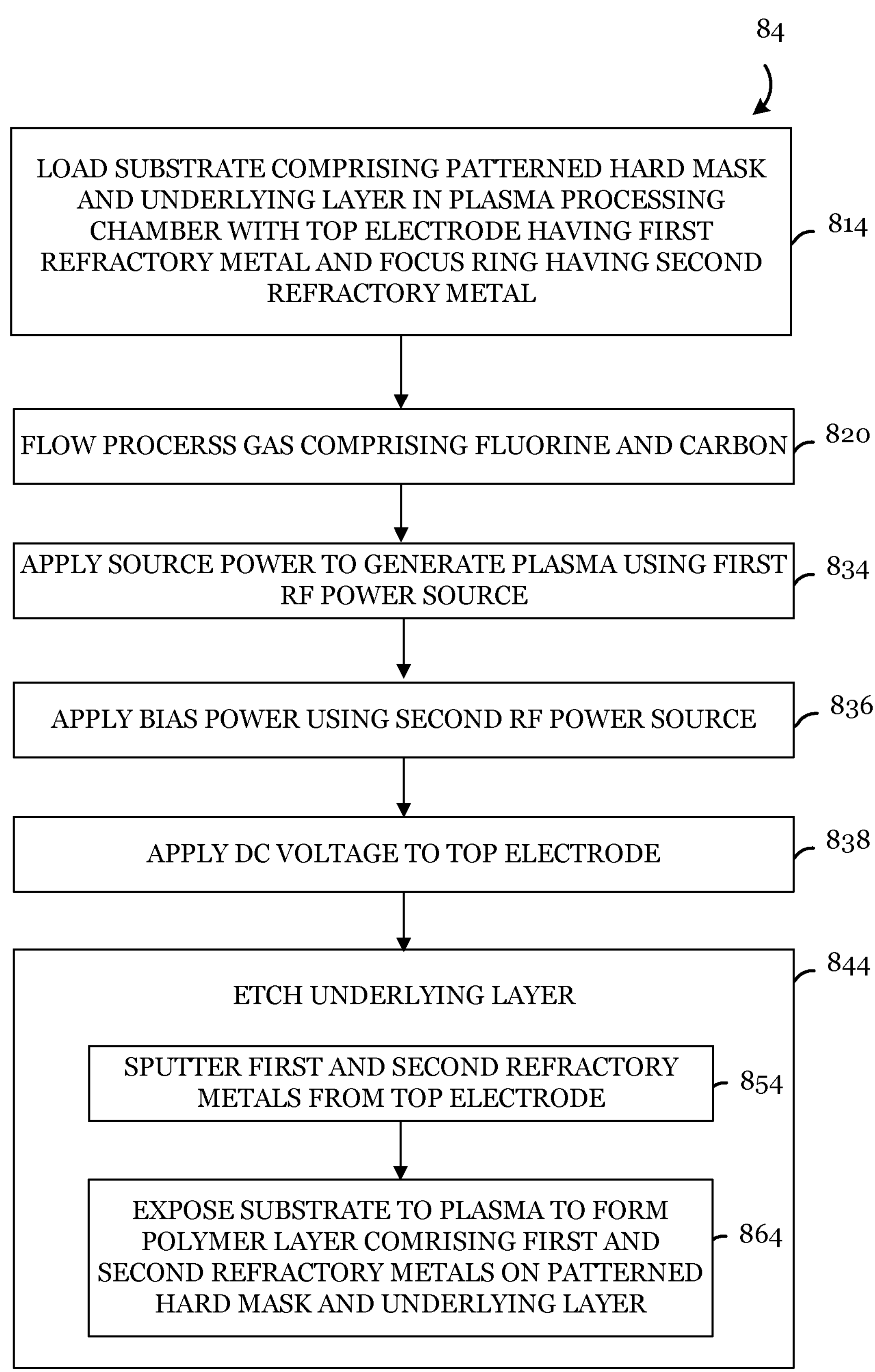

FIG. 7 illustrates cross sectional views of an example substrate 100 at the center and the edge during an example high aspect ratio (HAR) patterning process with a radial gradient of a transition metal in accordance with various embodiments.

Generally in a plasma etch process for HAR patterning, CD control may be particularly challenging at an edge portion of the substrate because of discontinuity of the plasma at the edge. For example, lateral etch may be more likely to occur near the edge of the substrate and thereby lead to undesired local CD enlargement. This edge-specific CD control issue may advantageously be addressed by creating a radial gradient of the deposited metal such that the sidewall passivation is locally strengthened near the edge portion of the substrate.

As illustrated in FIG. 7, a plasma etch process may be performed using a plasma system comprising a focus ring 154 coated with a focus ring metal-containing coating 156 on the surface. Although not illustrated in FIG. 7, other chamber parts may also comprise a metal. The substrate 100 may comprise a patterned layer 320 and a material layer 310, similar to those illustrated in FIGS. 3, 4, and 5A-5B, and thus will not be repeated in detail. As indicated by arrows in FIG. 7, (a solid arrow for the edge and a dotted arrow for the center), due to the proximity to the focus ring 154, the edge portion of the substrate 100 may be subject to a greater flux of sputtered metal than the central portion. The plasma process conditions for metal sputtering may be further adjusted to increase the gradient in sputtered metal flux. In one embodiment, an additional RF power may be applied to the focus ring 154 to increase the metal sputtering yield and thereby increase the gradient in sputtered metal flux. In another embodiment, with an additional temperature controller configured to heat/cool the focus ring 154, the focus ring 154 may be heated to increase the metal sputtering yield. The sputtered metal may then be deposited on the substrate 100 to form a passivation layer comprising metal and carbon, and the gradient in sputtered metal flux may result in non-uniform composition of the passivation layer across the substrate 100. In various embodiments, an edge passivation layer 710 may contain more metal than a central passivation layer 715. As illustrated in FIG. 7, the edge passivation layer 710 may be thicker than the central passivation layer 715. In one or more embodiments, the plasma process conditions may be selected such that the metal content in the central passivation layer 715 may be negligible or the central passivation layer 715 may not be formed at all. The difference in metal content may provide different levels of sidewall passivation across the substrate 100, for example, to a greater extent for the edge portion. In certain embodiments, the focus ring 154 of the plasma processing system may be the only metal-containing chamber part, which may be advantageous in enabling the radial gradient of the sputtered metal.

FIGS. 8A-8C illustrate a process flow diagrams of a reactive ion etching (RIE) process in accordance with various embodiments. These process flows can be followed with the figures discussed above (e.g., FIGS. 3, 4, 5A-5B, and 7) and hence will not be described again.

In FIG. 8A, a process flow 80 starts with loading a substrate in a plasma processing chamber (block 810, FIG. 5A), where the substrate comprises a patterned hard mask layer and an underlying layer and the plasma processing chamber comprises a chamber part having a surface comprising a refractory metal (e.g., W) and a first electrode. Next, a process gas comprising fluorine and carbon may be flowed into the plasma processing chamber (block 820). While flowing the process gas, a source power is then applied to the first electrode of the plasma processing chamber to generate a plasma in the plasma processing chamber (block 830). Subsequently, the etching of the underlying layer (block 840, FIG. 5B) may be performed by first exposing the surface of the chamber part to the plasma to sputter the refractory metal (block 850, FIG. 3), and exposing the substrate to plasma to form a recess in the underlying layer and a conductive polymer layer comprising the refractory metal over sidewalls of the patterned hard mask layer and the underlying layer (block 860, FIG. 4).

In FIG. 8B, another process flow 82 starts with loading a substrate in a plasma processing chamber (block 812, FIG. 5A), where the substrate comprises a patterned hard mask layer and an underlying layer and the plasma processing chamber comprises a focus ring having a surface comprising a refractory metal (e.g., W) and a first electrode. Next, a process gas comprising fluorine and carbon may be flowed into the plasma processing chamber (block 820). While flowing the process gas, a source power is then applied to the first electrode of the plasma processing chamber to generate a plasma in the plasma processing chamber (block 830). Subsequently, the etching of the underlying layer (block 842, FIG. 5B) may be performed by first exposing the surface of the focus ring to the plasma to sputter the refractory metal (block 852, FIGS. 3 and 7), and exposing the substrate to plasma to form a recess in the underlying layer and a conductive polymer layer comprising the refractory metal deposited over the substrate with a radial gradient such that a concentration of the refractory metal near an edge portion of the substrate is higher than a central portion of the substrate (block 862, FIGS. 4 and 7).

In FIG. 8C, yet another process flow 84 starts with loading a substrate in a plasma processing chamber (block 814, FIG. 5A), where the substrate comprises a patterned hard mask layer and an underlying layer and the plasma processing chamber comprises a top electrode having a surface comprising a first refractory metal (e.g., W, Mo, Nb, Ta, or Ru) and a focus ring having a surface comprising a second refractory metal (e.g., W, Mo, Nb, Ta, or Ru). Next, a process gas comprising fluorine and carbon may be flowed into the plasma processing chamber (block 820). While flowing the process gas, a source power is then applied to a bottom electrode of the plasma processing chamber using a first RF power source to generate a plasma in the plasma processing chamber (block 834). A bias power is also applied to the bottom electrode using a second RF power source (block 836). A DC voltage is also applied to the top electrode using a DV voltage source (block 838). Subsequently, the etching of the underlying layer (block 844, FIG. 5B) may be performed by first sputtering the first and second refractory metals (block 854, FIG. 3), and exposing the substrate to plasma to form a recess in the underlying layer and a conductive polymer layer comprising the first and second refractory metals over sidewalls of the patterned hard mask layer and the underlying layer (block 864, FIG. 4).

Example embodiments of the invention are summarized here. Other embodiments can also be understood from the entirety of the specification as well as the claims filed herein.

Example 1. A method of etching a substrate that includes: loading the substrate into a plasma etch chamber, the substrate including a patterned hard mask layer and an underlying layer, the plasma etch chamber including a chamber part having a surface including a refractory metal, and a first electrode; flowing a process gas including fluorine and carbon into the plasma etch chamber; while flowing the process gas, applying a source power to the first electrode of the plasma etch chamber to generate a plasma in the plasma etch chamber; and etching the underlying layer, the etching including exposing the surface of the chamber part to the plasma to sputter the refractory metal from the surface of the chamber part, and forming a recess in the underlying layer and a conductive polymer layer including the refractory metal over sidewalls of the patterned hard mask layer and the underlying layer, the forming including exposing the substrate to the plasma.

Example 2. The method of example 1, where the refractory metal is tungsten, molybdenum, niobium, tantalum, or ruthenium.

Example 3. The method of one of examples 1 or 2, where the conductive polymer layer includes metal carbide.

Example 4. The method of one of examples 1 to 3, where the conductive polymer layer provides sidewall passivation during the etching.

Example 5. The method of one of examples 1 to 4, further including discharging charges carried by ions from the sidewalls through the conductive polymer layer.

Example 6. The method of one of examples 1 to 5, where the chamber part is a focus ring surrounding the substrate.

Example 7. The method of one of examples 1 to 6, where the plasma is an inductively coupled plasma (ICP), and where the chamber part is a top plate disposed at an upper wall of the plasma etch chamber.

Example 8. The method of one of examples 1 to 6, where the plasma is a capacitively coupled plasma (CCP), and where the chamber part is a second electrode disposed in an upper portion of the plasma etch chamber.

Example 9. A method of etching a substrate that includes: loading the substrate into a plasma etch chamber, the substrate including a patterned hard mask layer and an underlying layer, the plasma etch chamber including: a focus ring having a surface including a refractory metal; and a first electrode; flowing a process gas including fluorine and carbon into the plasma etch chamber; while flowing the process gas, applying a source power to the first electrode of the plasma etch chamber to generate a plasma in the plasma etch chamber; and etching the underlying layer, the etching including exposing the surface of the focus ring to the plasma to sputter the refractory metal from the surface of the chamber part, and exposing the substrate to the plasma to form a recess in the underlying layer, where a conductive polymer layer including the refractory metal is deposited over the substrate with a radial gradient such that a concentration of the refractory metal in the conductive polymer layer near an edge portion of the substrate is higher than a central portion of the substrate.

Example 10. The method of example 9, where the refractory metal is tungsten, molybdenum, niobium, tantalum, or ruthenium.

Example 11. The method of one of examples 9 or 10, where the conductive polymer layer includes metal carbide.

Example 12. The method of one of examples 9 to 11, further including tuning the radial gradient, the tuning including changing the source power.

Example 13. The method of one of examples 9 to 12, further including tuning the radial gradient, the tuning including tuning a temperature of the substrate.

Example 14. The method of one of examples 9 to 13, where tuning the temperature of the substrate further including creating a radial temperature gradient across the substrate.

Example 15. A method of etching a substrate that includes: loading the substrate into a plasma etch chamber, the substrate including a patterned hard mask layer and an underlying layer, the plasma etch chamber including a top electrode having a surface including a first refractory metal, a bottom electrode, a first radio frequency (RF) power source connected to the bottom electrode, a second radio frequency (RF) power source connected to the bottom electrode, a direct current (DC) voltage source connected to the top electrode, and a focus ring having a surface including a second refractory metal; flowing a process gas including fluorine and carbon into the plasma etch chamber; while flowing the process gas, applying a source power to the bottom electrode using the first RF power source to generate a plasma in the plasma etch chamber; applying a bias power to the bottom electrode using the second RF power source; applying a DC voltage to the top electrode using the DC voltage source; and etching the underlying layer, the etching including sputtering the first and second refractory metals from the top electrode, and exposing the substrate to the plasma to form a recess in the underlying layer, where a conductive polymer layer including the first and second refractory metals is deposited sidewalls of the patterned hard mask layer and the underlying layer.

Example 16. The method of example 15, where the first refractory metal is tungsten, molybdenum, niobium, tantalum, or ruthenium, and where the second refractory metal is tungsten, molybdenum, niobium, tantalum, or ruthenium.

Example 17. The method of one of examples 15 or 16, where the first and second refractory metals are a same metal.

Example 18. The method of one of examples 15 to 17, further including tuning the plasma such that the conductive polymer layer near an edge portion of the substrate is thicker than a central portion of the substrate.

Example 19. The method of one of examples 15 to 18, where tuning the plasma includes adjusting the source power, the bias power, or the DC voltage.

Example 20. The method of one of examples 15 to 19, where tuning the plasma including creating a radial temperature gradient across the substrate.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of etching a substrate, the method comprising:

loading the substrate into a plasma etch chamber, the substrate comprising a patterned hard mask layer and an underlying layer, the plasma etch chamber comprising
- a chamber part having a surface comprising a refractory metal, and
- a first electrode;

flowing a process gas comprising fluorine and carbon into the plasma etch chamber;

while flowing the process gas, applying a source power to the first electrode of the plasma etch chamber to generate a plasma in the plasma etch chamber; and etching the underlying layer, the etching comprising
- exposing the surface of the chamber part to the plasma to sputter the refractory metal from the surface of the chamber part, and
- forming a recess in the underlying layer and a conductive polymer layer comprising the refractory metal over sidewalls of the patterned hard mask layer and the underlying layer, the forming comprising exposing the substrate to the plasma.

2. The method of claim 1, wherein the refractory metal is tungsten, molybdenum, niobium, tantalum, or ruthenium.

3. The method of claim 1, wherein the conductive polymer layer comprises metal carbide.

4. The method of claim 1, wherein the conductive polymer layer provides sidewall passivation during the etching.

5. The method of claim 1, further comprising discharging charges carried by ions from the sidewalls through the conductive polymer layer.

6. The method of claim 1, wherein the chamber part is a focus ring surrounding the substrate.

7. The method of claim 1, wherein the plasma is an inductively coupled plasma (ICP), and wherein the chamber part is a top plate disposed at an upper wall of the plasma etch chamber.

8. The method of claim 1, wherein the plasma is a capacitively coupled plasma (CCP), and wherein the chamber part is a second electrode disposed in an upper portion of the plasma etch chamber.

9. A method of etching a substrate, the method comprising:

loading the substrate into a plasma etch chamber, the substrate comprising a patterned hard mask layer and an underlying layer, the plasma etch chamber comprising:
- a focus ring having a surface comprising a refractory metal; and
- a first electrode;

flowing a process gas comprising fluorine and carbon into the plasma etch chamber;

while flowing the process gas, applying a source power to the first electrode of the plasma etch chamber to generate a plasma in the plasma etch chamber; and etching the underlying layer, the etching comprising
- exposing the surface of the focus ring to the plasma to sputter the refractory metal from the surface of a chamber part of the plasma etch chamber, and
- exposing the substrate to the plasma to form a recess in the underlying layer, wherein a conductive polymer layer comprising the refractory metal is deposited over the substrate with a radial gradient such that a concentration of the refractory metal in the conductive polymer layer near an edge portion of the substrate is higher than a central portion of the substrate.

10. The method of claim 9, wherein the refractory metal is tungsten, molybdenum, niobium, tantalum, or ruthenium.

11. The method of claim 9, wherein the conductive polymer layer comprises metal carbide.

12. The method of claim 9, further comprising tuning the radial gradient, the tuning comprising changing the source power.

13. The method of claim 9, further comprising tuning the radial gradient, the tuning comprising tuning a temperature of the substrate.

14. The method of claim 13, wherein tuning the temperature of the substrate further comprising creating a radial temperature gradient across the substrate.

15. A method of etching a substrate, the method comprising:

loading the substrate into a plasma etch chamber, the substrate comprising a patterned hard mask layer and an underlying layer, the plasma etch chamber comprising
- a top electrode having a surface comprising a first refractory metal,
- a bottom electrode,
- a first radio frequency (RF) power source connected to the bottom electrode, a second radio frequency (RF) power source connected to the bottom electrode, a direct current (DC) voltage source connected to the top electrode, and a focus ring having a surface comprising a second refractory metal;

flowing a process gas comprising fluorine and carbon into the plasma etch chamber;

while flowing the process gas, applying a source power to the bottom electrode using the first RF power source to generate a plasma in the plasma etch chamber;

applying a bias power to the bottom electrode using the second RF power source;

applying a DC voltage to the top electrode using the DC voltage source; and etching the underlying layer, the etching comprising sputtering the first and second refractory metals from the top electrode, and exposing the substrate to the plasma to form a recess in the underlying layer, wherein a conductive polymer layer comprising the first and second refractory metals is deposited on sidewalls of the patterned hard mask layer and the underlying layer.

16. The method of claim 15, wherein the first refractory metal is tungsten, molybdenum, niobium, tantalum, or ruthenium, and wherein the second refractory metal is tungsten, molybdenum, niobium, tantalum, or ruthenium.

17. The method of claim 15, wherein the first and second refractory metals are a same metal.

18. The method of claim 15, further comprising tuning the plasma such that the conductive polymer layer near an edge portion of the substrate is thicker than a central portion of the substrate.

19. The method of claim 18, wherein tuning the plasma comprises adjusting the source power, the bias power, or the DC voltage.

20. The method of claim 18, wherein tuning the plasma comprising creating a radial temperature gradient across the substrate.

* * * * *